(12) United States Patent
Minowa

(10) Patent No.: US 9,110,342 B2
(45) Date of Patent: Aug. 18, 2015

(54) TFT ARRAY SUBSTRATE, LIQUID CRYSTAL PANEL HAVING THE SAME, AND METHOD OF MANUFACTURING THE TFT ARRAY SUBSTRATE

(71) Applicant: MITSUBISHI ELECTRIC CORPORATION, Tokyo (JP)

(72) Inventor: Kenichi Minowa, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/061,445

(22) Filed: Oct. 23, 2013

(65) Prior Publication Data
US 2014/0132869 A1    May 15, 2014

(30) Foreign Application Priority Data

Nov. 12, 2012 (JP) .................. 2012-248616
Sep. 20, 2013 (JP) .................. 2013-195031

(51) Int. Cl.
*G02F 1/1343* (2006.01)
*G02F 1/1368* (2006.01)
*H01L 27/12* (2006.01)
*G02F 1/1362* (2006.01)

(52) U.S. Cl.
CPC ........ *G02F 1/134363* (2013.01); *G02F 1/1368* (2013.01); *G02F 1/136259* (2013.01); *H01L 27/1244* (2013.01); *G02F 2001/134372* (2013.01)

(58) Field of Classification Search
CPC ........................................... G02F 2001/134372
See application file for complete search history.

(56) References Cited

U.S. PATENT DOCUMENTS

2008/0303024 A1*  12/2008 Song et al. .............. 257/59
2011/0109861 A1    5/2011 Son et al.
2013/0222726 A1*  8/2013 Choi et al. .............. 349/43

FOREIGN PATENT DOCUMENTS

JP        2011-107678 A    6/2011

* cited by examiner

*Primary Examiner* — Dennis Y Kim
(74) *Attorney, Agent, or Firm* — Studebaker & Brackett PC

(57) ABSTRACT

A TFT array substrate includes: a pixel electrode, which is arranged in a pixel region formed in a matrix shape by a gate wiring and a source wiring on an insulating substrate; a switching element, which is disposed at an intersection of the gate wiring and the source wiring; a counter electrode, which is formed on the pixel electrode with interposing an insulating film; and a silicon film is formed on a lower layer so as to face the source wiring, wherein the source wiring and the pixel electrode are formed of the same transparent conductive material layer, and the source wiring and the silicon film are formed so that end faces of the source wiring and the silicon film are overlapped and a width of the source wiring is identical to a width of the silicon film, in a plan view.

4 Claims, 4 Drawing Sheets

TFT ARRAY SUBSTRATE, LIQUID CRYSTAL PANEL HAVING THE SAME, AND METHOD OF MANUFACTURING THE TFT ARRAY SUBSTRATE

CROSS-REFERENCE TO RELATED APPLICATION

This application claims priority from Japanese Patent Application No. 2012-248616 filed on Nov. 12, 2012 and 2013-195031 filed on Sep. 20, 2013, the entire subject matter of which is incorporated herein by reference.

TECHNICAL FIELD

This disclosure relates to a TFT (Thin Film Transistor, a switching element for driving a liquid crystal formed on a liquid crystal panel) array substrate, a liquid crystal panel having the TFT array substrate, and a method of manufacturing the TFT array substrate.

BACKGROUND

A display device using a liquid crystal panel or the like is recently utilized in various fields including a television, a car navigation system, and a computer, in view of its light weight, thin, and low power consumption. Specifically, as a demand for display quality of the liquid crystal panel is increased every year, employing a mode of driving the liquid crystal panel in an increased contrast and a widened view angle becomes a mainstream.

Specifically, an IPS (In-Plane Switching; hereinafter referred to as IPS) drive mode is superior in view of the above-described properties, liquid crystal manufacturing companies employing the above drive mode are increased.

The general liquid crystal panel of the IPS drive mode includes a pair of substrates facing each other, and a gap between the substrates is constantly maintained by a spacer, and the gap is filled with liquid crystal molecules. One of the substrates is a an active matrix type TFT array substrate including pixel electrodes, which is arranged in a region formed in a matrix shape by a gate wiring and a source wiring, and a TFT, which is formed at an intersection of both wirings, and a counter electrode formed on the same substrate. The drive of the liquid crystal molecules is controlled by electric charges accumulated between the pixel electrode and the counter electrode.

The other substrate facing the above TFT array substrate is an opposite substrate including a color filter (hereinafter referred to as CF). The opposite substrate is provided with a black matrix shielding a domain region of the liquid crystal molecules, a coloring material layer, an organic film layer, and a columnar spacer, and a conductive film is generally not formed. The IPS drive mode realizes the highly widened view angle by forming the pixel electrodes and the counter electrode on the same substrate (TFT array substrate), and generating an electric field in a parallel direction with respect to both substrates to move the liquid crystal molecules in a horizontal direction.

As a drive mode further evolved from the IPS drive mode, an FFS (Fringe Field Switching; hereinafter referred to as FFS) mode is being developed. A difference between the liquid crystal panels of the IPS drive mode and the FFS mode is that an insulating film is interposed between the pixel electrode and the counter electrode to form an another layer, and an electric field is generated in a more horizontally direction along a substrate planar direction when a voltage is applied, thereby further realizing the increased contrast and the widened view angle.

According to the FFS drive mode, since the insulating film is interposed between the pixel electrode and the counter electrode to form another layer, as described above, the number of masks is increased when each electrode is formed by patterning, which increases its cost. Therefore, to reduce the number of masks, a method of eliminating the insulating film between the source wiring and the pixel electrode and forming the source wiring and the pixel electrode on the same layer may be used. (see JP-A-2011-107678 (page 8 and FIG. 6))

SUMMARY

According to the liquid crystal display device of the FFS drive mode disclosed in JP-A-2011-107678, in the case where a data line (source wiring) and the pixel electrode are formed of the same layer, the data line and the pixel electrode are formed at a constant interval so that they are not in contact with each other. However, occurrence of a defect, which is caused by pattern residue of the data line, the pixel electrode, or the like due to mix of alien substances at the time of forming the data line and the pixel electrode in a certain probability, could not be avoided in production. If the pattern residue is created, a short circuit between the data line and the pixel electrode occurs, so that a dot-like defect, i.e., a point defect, occurs on a mono chromatic screen (including a fully black screen) or a middle halftone display screen according to a kind of display screen at the time of driving the liquid crystal panel.

Specifically, in a case where the above problem occurs on a cross-talk inspection screen to inspect a defect of cross-talk (leakage current of a signal to an adjacent pixel), the point defect that is brighter than surroundings occurs. This will cause decreasing of the quality to or a yield, thereby degrading the liquid crystal display device due to the decreased yield or making a B grade product having a brightness point.

For a simple test capable of executing display inspection of the liquid crystal panel using relatively inexpensive equipment to collectively drive the source wiring or the gate wiring, it is difficult to find the problem. Therefore, in a case where the problem is found by the inspection after mounting, a mounting member is wasted before that.

Although a method of repairing the pattern residue by laser or the like can be conceived, investment of the equipment for finding the defect or the repair device is needed, so that a further repair process is required, thereby increasing a production load. Further, there is a problem in that a repair residue is dispersed to cause a defect to occur in the liquid crystal panel.

In view of the above, this disclosure is to suppress a problem, such as a point defect, from occurring due to short circuit of a source wiring and a pixel electrode at a process of manufacturing a liquid crystal panel including the source wiring and the pixel electrode formed of the same layer, thereby suppressing the degradation in a quality or a production yield.

A TFT array substrate employing a fringe field mode of this disclosure, comprises: a pixel electrode, which is arranged in a pixel region formed in a matrix shape by a gate wiring and a source wiring on an insulating substrate; a switching element, which is disposed at an intersection of the gate wiring and the source wiring; a counter electrode, which is formed on the pixel electrode with interposing an insulating film; and a silicon film is formed on a lower layer so as to face the source wiring, wherein the source wiring and the pixel electrode are formed of the same transparent conductive material layer, and wherein the source wiring and the silicon film are formed so that end faces of the source wiring and the silicon film are overlapped and a width of the source wiring is identical to that of the silicon film. Additionally, this disclosure will be applied to the liquid crystal panel having the above TFT array substrate and the manufacturing thereof.

According to the TFT array substrate of this disclosure, it is possible to suppress occurrence of a line defect due to the short circuit of the pixel electrode and the source wiring during a manufacturing process, thereby suppressing degradation in a quality or a production yield.

BRIEF DESCRIPTION OF THE DRAWINGS

The foregoing and additional features and characteristics of this disclosure will become more apparent from the following detailed descriptions considered with the reference to the accompanying drawings, wherein.

DETAILED DESCRIPTION

Illustrative Embodiment

Figure 1:
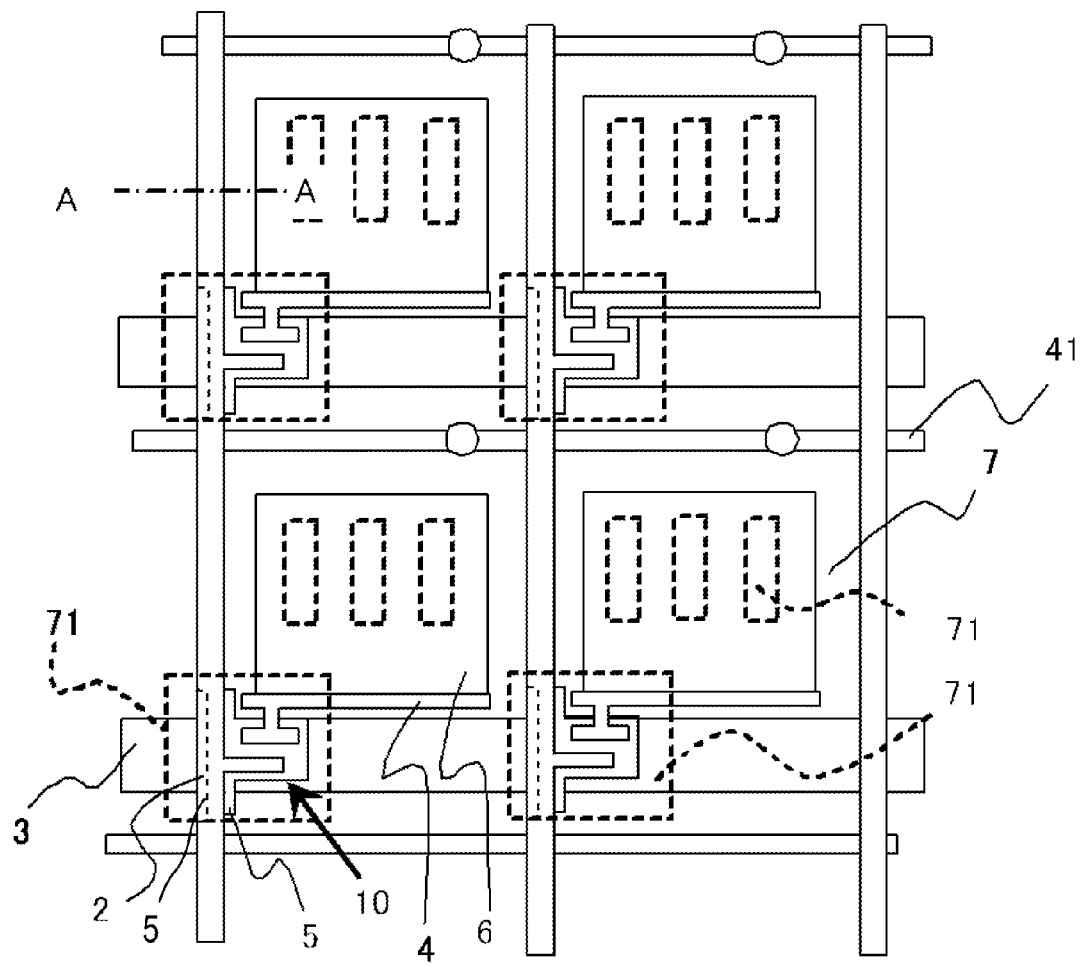
FIG. 1 is a plan view illustrating the configuration of pixels on a TFT array substrate constituting a liquid crystal panel according to this disclosure.

An embodiment of a TFT array substrate and a liquid crystal panel according to this disclosure, which employs an FFS drive mode, will now be described with reference to the accompanying drawings. Incidentally, the substantially same components are denoted by identical reference numerals throughout the drawings.

Figure 2:
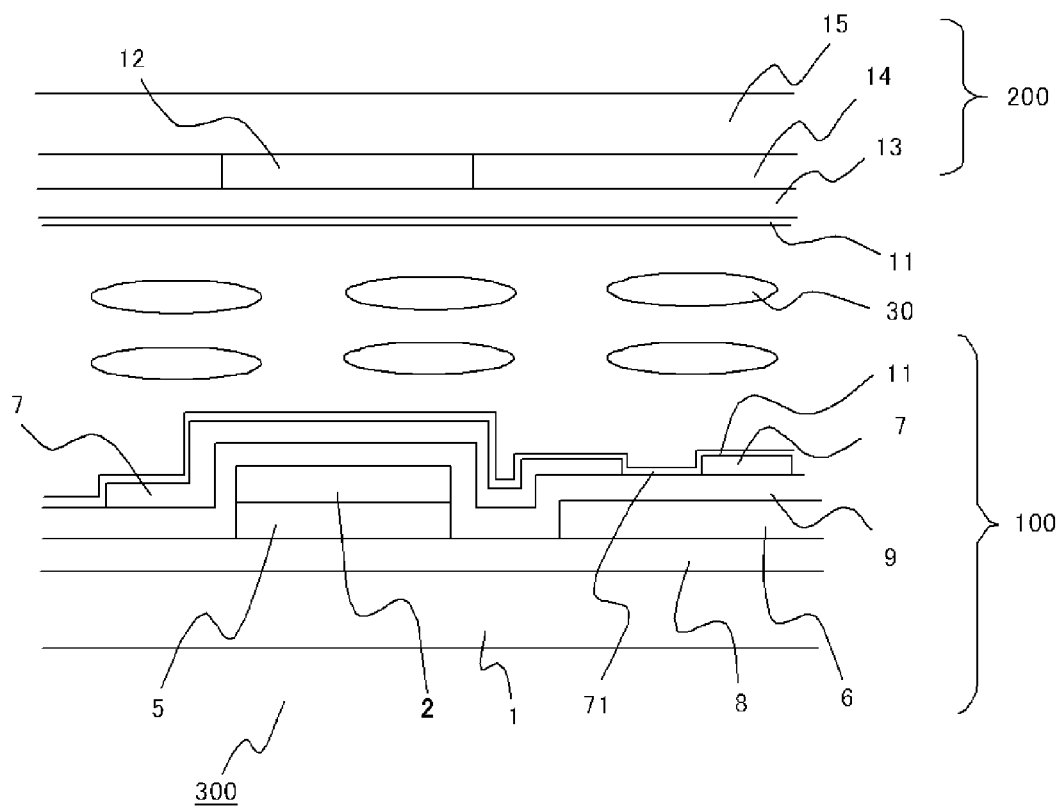
FIG. 2 is a cross-sectional view taken along the line A-A in FIG. 1 in a state where an opposite substrate is disposed on the TFT array substrate.
Figure 3:
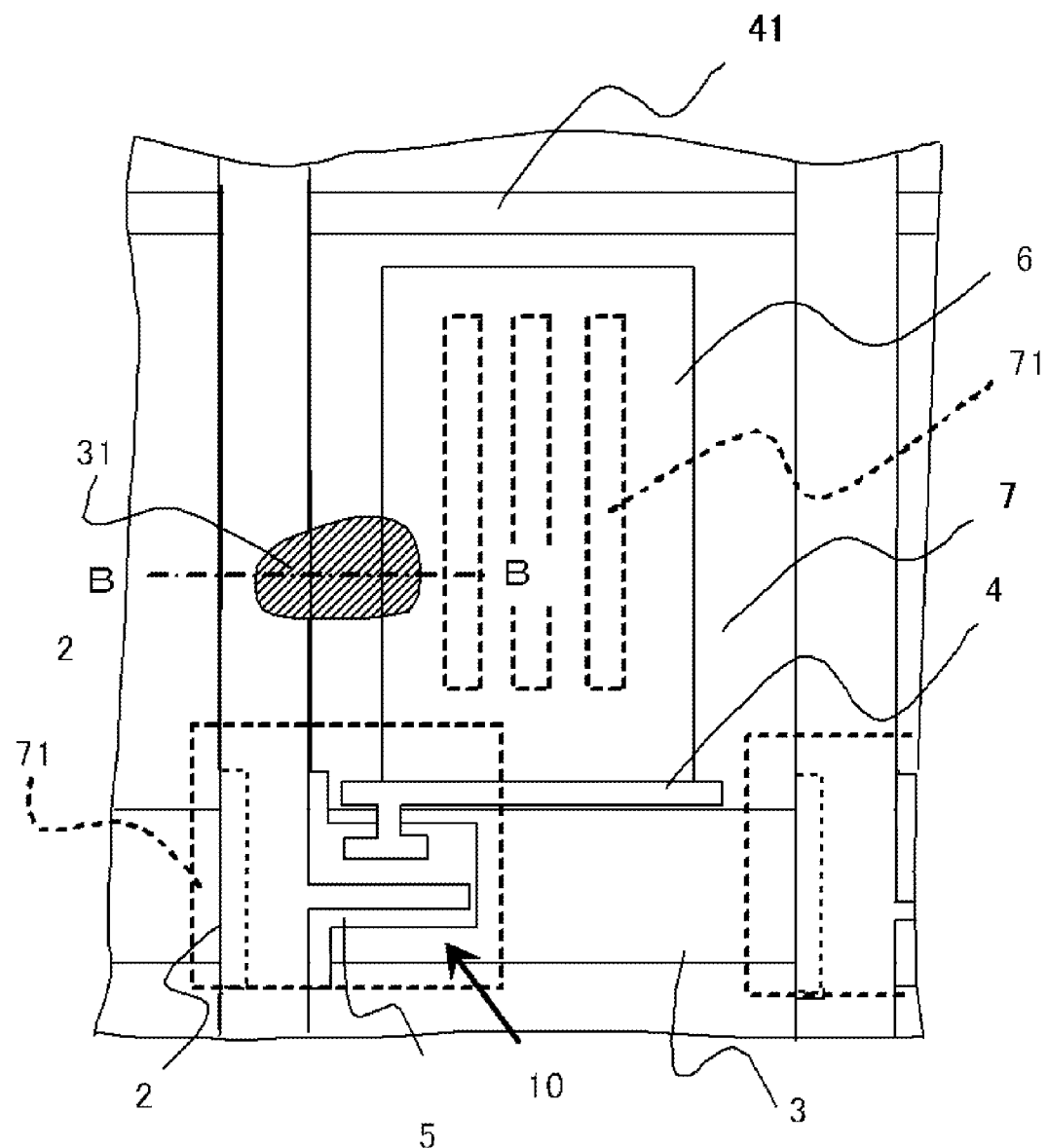
FIG. 3 is a plan view illustrating one pixel of the TFT array substrate according to this disclosure.
Figure 4:
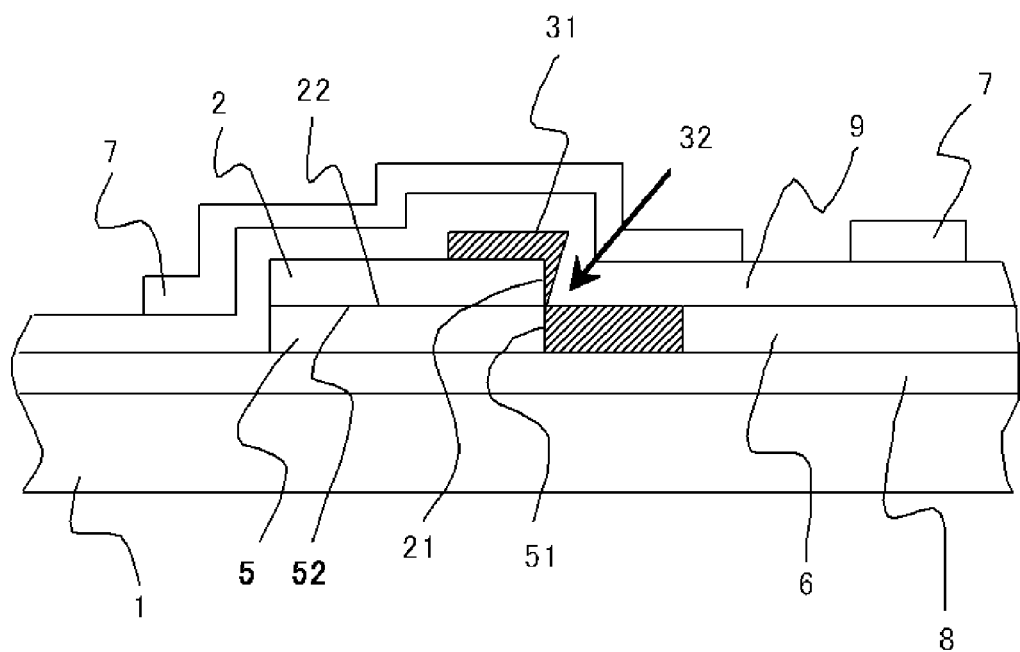
FIG. 4 is a cross-sectional view taken along the line B-B in FIG. 3.

FIG. 1 is a plan view illustrating the configuration of pixels on a TFT array substrate constituting a liquid crystal panel according to this disclosure. FIG. 2 is a cross-sectional view taken along the line A-A in FIG. 1 in a state where an opposite substrate is disposed on the TFT array substrate. FIG. 3 is a plan view illustrating one pixel of the TFT array substrate according to this disclosure. FIG. 4 is a cross-sectional view taken along the line B-B in FIG. 3.

As illustrated in FIG. 1 or 2, the liquid crystal panel of the FFS drive mode according to this disclosure includes a pair of opposite substrates, and a gap between the substrates is filled with liquid crystal molecules 30. A TFT array substrate 100 which is one substrate of a pair of substrates has gate wirings 3 and source wirings 2 which are arranged in a matrix shape with interposing a first insulating film 8 on an insulating substrate 1. Further, a silicon film 5 is formed along the source wirings 2 below the source wirings 2. At the intersection of the gate wirings 3 and the source wirings 2, a protrusion of the silicon film 5 and the source wiring 2 and a drain electrode 4 are formed on the same layer as the source wiring 2, thereby constituting a TFT 10 which is a switching element for driving the liquid crystal panel 300. Further, a pixel electrode 6 is formed in a pixel region surrounded by the gate wiring 3 and the source wiring 2. The pixel electrode 6 is directly connected to the drain electrode 4 constituting the TFT 10, and thus it is applied by a voltage via the drain electrode 4. Further, a counter electrode 7 is formed in a region, except for an opening 71 indicated by a dotted line, with interposing a second insulating film 9. The opening 71 is arranged in the pixel region and a region forming the TFT 10.

The conductive film forming these wirings or electrodes generally employs a transparent electrode of ITO (Indium Tin Oxide) or IZO (Indium Zinc Oxide) which is a transparent conductive material, or a metal electrode of Cr, Al or the like. In this instance, an orientation film 11 is disposed on the entire surface of the counter electrode 7. The orientation film 11 is provided to orient the liquid crystal molecules 30, and is made of polyimide or the like.

An opposite substrate 200 which is the other substrate of the pair of substrates has a black matrix 12 for shielding a domain region of the liquid crystal molecules 30, a coloring material layer 14, an organic film layer 13, and a spacer (not illustrated) formed on an insulating substrate 15. Similar to the TFT array substrate 100, an orientation film 11 is disposed on the entire surface of the opposite substrate 200. In this way, the liquid crystal panel 300 is configured by the TFT array substrate 100 and the opposite substrate 200 with overlapping with each other. In the liquid crystal panel 300 of this disclosure, when the voltage is applied to the TFT 10, two electrodes of the pixel electrode 6 and the counter electrode 7 generate an electric field in a horizontal direction to a planar direction of both substrates. Since two electrodes of the pixel electrode 6 and the opposite electrode 7 are formed in a two-layered structure with interposing a second insulating film 9, it can realize a high contrast, a high view angle, and a high optical transmittance, as compared with a liquid crystal panel of an IPS drive mode in which both electrodes are formed on the same layer. Since the FSS drive mode generally generates the electric field in a more horizontally direction, as compared with the IPS drive mode, the liquid crystal molecules can be driven in the more horizontally direction, thereby realizing the high contrast.

A method of manufacturing the TFT array substrate 100 according to this disclosure will now be described with reference to FIG. 1 or 2. As illustrated in FIGS. 1 and 2, after the gate wirings 3 and a storage capacitor wiring 41 are formed on the insulating substrate 1 of the TFT array substrate 100, the silicon film 5 is patterned to intersect the gate wiring 3 with interposing the first insulating film 8. Next, a metallic conductive film is patterned, so that the source wiring 2 is formed to overlap with the silicon film 5. Simultaneously, the pixel electrode 6 is formed in the pixel region on the same layer as the source wiring 2. Since the pixel electrode 6 and the source wiring 2 are formed of the same layer, the source wiring 2 is formed so that an interval between the source wiring and the pixel electrode is maintained not to be short-circuited from the pixel electrode 6, that is, the source wiring is not in contact with the pixel electrode. In this instance, the metallic conductive film which is a material of the source wiring 2 and the pixel electrode 6 employs a transparent electrode, such as ITO or IZO, which is a transparent conductive material, or a metal electrode, such as Cr or Al.

At an intersection of the gate wiring 3 and the source wiring 2, the silicon film 5 and the source wiring 2 partially protrude from the TFT 10. Then, the second insulating film 9 is formed, and the counter electrode 7 having the opening 71 is formed in the pixel region. Further, in this disclosure, the counter electrode 7 is formed on the source wiring 2, except for the region in which the TFT 10 is formed, thereby interrupting a voltage from the source wiring 2 to suppress the voltage from applying to the pixel region from the source wiring 2.

As illustrated in FIGS. 3 and 4, as a region except for the intersection of the source wiring 2 and the gate wiring 3, that is, the region in which the TFT 10 is formed, an end face 21 of the source wiring 2 and an end face 51 of the silicon film 5 which is the lower layer are formed in a state where there is no stepped portion on both end faces, so that the end face 21 and the end face 51 are located at an overlap position. That is, both end faces 21 and 51 are formed to be flush with each other. That is, in a sectional shape, the end face 21 of the source wiring 2 and the end face 51 of the silicon film 5 which is the lower layer coincide with each other in a plan view, and the end faces of the source wiring 2 and the silicon film 5 are overlapped in a plan view. Specifically, as shown in FIG. 3, both end faces of the source wiring 2 respectively coincide with both end faces of the silicon film 5. That is, a width of the source wiring 2 is identical to a width of the silicon film 5 in a plan view.

In a comparative case where a width of the source wiring is formed to be larger than a width of the silicon film in a plan view, the source wiring continually covers the end face of silicon film. On the other hand, in this disclosure, since the source wiring 3 does not cover the end face of the silicon film 5, an etching solution used at the patterning of the source wiring 2 is immersed into a bottom surface 22 of the source wiring 2 and is diffused onto an upper surface 52 of the silicon film 5, the end face 21 of the source wiring 2 is excessively eroded. Accordingly, a taper angle of the end face 21 of the source wiring 2 is sharp with respect to the planar direction of the insulating substrate 1. It is preferable that the taper angle of the end face 21 is a substantially right angle.

Next, as illustrated in FIG. 2, after the second insulating film 9 and the counter electrode 7 are continuously formed, a portion of the counter electrode 7 formed in the pixel region and a portion in which the TFT 10 is formed are removed, and the opening 71 is formed by a patterning process. Subsequently, the orientation film 11 is formed. The opposite substrate 200 is attached to the array substrate 100 around its substrate so that it is opposite to the array substrate 100, and the liquid crystal molecules 30 are filled between both substrates, thereby completing the liquid crystal panel.

The operation of this disclosure will now be described. As illustrated in FIGS. 3 and 4, the end face 21 of the source wiring 2 and the end face 51 of the silicon film 5 which is the lower layer are formed to be arranged, and the taper angle of the end face 21 of the source wiring 2 is sharp with respect to the planar direction of the insulating substrate 1. The end face 21 is preferably formed to have a substantially right angle. Herein, the substantially right angle means is substantially 90 degrees, but the angle of the end face 21 is set in the range of 90 degrees to 120 degrees. Incidentally, according to the excessive erosion and the taper angle over 90 degrees at end face 21 of the source wiring 2, although lower end of the source wiring 2 may be inconsiderably different from a upper end of the silicon film 5, it is deemed as end face 21 of the source wiring 2 and end face 51 of the silicon film 5 are overlapped and a width of the source wiring 2 is identical to a width of the silicon film 5 in a plan view.

Additionally, if the angle of the end face 21 is smaller than the lower limit, 90 degrees, the pattern residue is not divided, which becomes a display defect. If the angle of the end face 21 is larger than the upper limit, 120 degrees, an adhesion of the source wiring 2 is deteriorated. Therefore, the angle of the end face 21 is set in the range of 90 degrees to 120 degrees. In this instance, the manufacturing method raises a temperature higher than a general manufacturing method to increase the adhesion between a resist and the source wiring 2 at a photomechanical process of the source wiring 2. In addition, as an etching time is set to be slightly longer than a normal time, the etching of the lower portion to the bottom surface 22 of the source wiring 2 is accelerated to form the above-described angle.

Since the end face 21 of the source wiring 2 is formed in this way, the alien substance may be attached to the source wiring at the pattern formation and thus be left as a residual film at the photomechanical process. Therefore, even in the case where the pattern residue 31 of the pixel electrode 6 is formed between the source wiring 2 and the pixel electrode 6, it is possible to suppress the pattern residue from being left on the end face 21. That is, as illustrated in FIG. 4, even in the case where the pattern residue 31 of the pixel electrode 6 is caused, a covering state of the pattern residue 31 of the pixel electrode 6 is deteriorated as compared with a case where a width of the source wiring is formed to be larger than a width of the silicon film in a plan view. Thus, the pattern residue 31 is divided (divided state 32) around the end face 21 of the source wiring 2, since the taper angle of the end face 21 of the source wiring 2 is formed to be sharp, that is, the substantially right angle, and the end face 21 of the source wiring 2 and the end face 51 of the silicon film 5 are formed at the overlapped position without the stepped portion.

In the case where the pattern residue 31 of the pixel electrode is caused and is a not-divided state different from this disclosure, the pixel electrode 6 and the source wiring 2 may be connected (short-circuited) by the pattern residue 31 of the pixel electrode 6, so that a charge is always applied to the pixel electrode 6 from the source wiring 2 of the short-circuited portion, thereby causing a brightness point defect.

According to the configuration of this disclosure, however, since the taper angle of the end face 21 of the source wiring 2 is formed to be sharp or the substantially right angle, and the end face 21 of the source wiring 2 and the end face 51 of the silicon film 5 are formed at the overlapped position without the stepped portion, the pattern residue 31 of the pixel electrode 6 is to be in the divided state 32. Therefore, it is possible to suppress the brightness point defect from occurring due to the short circuit between the source wiring 2 and the pixel electrode 6. It is normally displayed at a normal display time. Since the source wiring 2 and the pixel electrode 6 are suppressed from being short-circuited, the manufacturing process of this disclosure is possible to suppress deterioration in the quality and a production yield.

Since a repair by removing the pattern residue 31 of the pixel electrode 6 by irradiating laser or the like onto the brightness point defect is not necessarily, it is possible to decrease the number of processes and to suppress the display defect caused by the dispersed repair residue attached to other portion, by the repair such as the laser irradiation.

The intersected portion of the source wiring 2 and the gate wiring 3, that is, the region in which the TFT 10 is formed, is formed so that the end face 21 of the source wiring 2 and the end face 51 of the silicon film 5 are formed to not be flushed, thereby suppressing the source wiring 2 from being excessively eroded. As the end face 21 and the end face 51 are not formed at the overlapped position, for example, by forming the silicon film 5 to have a short width, it suppresses that the source wiring 2 is excessively eroded by the etching solution, and thus the source wiring 2 is short-circuited at the intersection of the source wiring 2 and the gate wiring 3. Further, as the taper of the drain electrode 4 is formed at a right angle even in the overlapped region of the drain electrode 4 and the pixel electrode 6, it is possible to suppress the pixel electrode 6 from being short-circuited.

What is claimed is:
1. A TFT array substrate employing a fringe field mode comprising:
a pixel electrode, which is arranged in a pixel region formed in a matrix shape by a gate wiring and a source wiring on an insulating substrate;

a switching element, which is disposed at an intersection of the gate wiring and the source wiring;

a counter electrode, which is formed on the pixel electrode with an insulating film interposed therebetween; and a silicon film formed on a lower layer so as to face the source wiring, wherein the source wiring and the pixel electrode are formed of the same transparent conductive material layer, and wherein the source wiring and the silicon film are formed so that end faces of the source wiring and the silicon film are overlapped and a width of the source wiring is identical to a width of the silicon film in a plan view; and wherein the end faces of the source wiring and the silicon film are formed to be flush with one another in the plan view outside of a region corresponding to the intersection of the gate wiring and the source wiring.

2. The TFT array substrate according to claim 1, wherein the source wiring and the silicon film are formed so that each width is identical to each other in a region, except for the region corresponding to the intersection of the gate wiring and the source wiring.

3. A liquid crystal panel, comprising the TFT array substrate according to claim 1, and an opposite substrate, which is opposite to the TFT array substrate, with liquid crystal molecules being disposed between the TFT array substrate and the opposite substrate.

4. A method of manufacturing a TFT array substrate including a pixel electrode arranged in a pixel region formed in a matrix shape by a gate wiring and a source wiring on an insulating substrate, a switching element disposed at an intersection of the gate wiring and the source wiring, and a counter electrode formed on the pixel electrode via an insulating film, the method comprising:

forming the gate wiring on the insulating substrate;

forming a silicon film formed in a matrix shape over the gate wiring;

forming the pixel electrode in the pixel region simultaneously with forming the source wiring on the silicon film of the same transparent material layer; and forming the counter electrode on the pixel electrode with interposing the insulating film therebetween, wherein the source wiring and the silicon film are formed so that end faces of the source wiring and the silicon film are overlapped and a width of the source wiring is identical to that of the silicon film; and wherein the end faces of the source wiring and the silicon film are formed to be flush with one another in the plan view outside of a region corresponding to the intersection of the gate wiring and the source wiring.

* * * * *